United States Patent [19]
Hahn et al.

[11] Patent Number: 4,833,392
[45] Date of Patent: May 23, 1989

[54] APPARATUS AND METHOD FOR MEASURING ELECTROSTATIC POLARIZATION

[75] Inventors: Erwin L. Hahn; John Clarke, both of Berkeley, Calif.; Tycho Sloater, Urbana, Ill.; Claude Hilbert, Austin, Tex.; Michael B. Heaney, Berkeley, Calif.

[73] Assignee: Regents of the University of California, Berkeley, Calif.

[21] Appl. No.: 76,869

[22] Filed: Jul. 23, 1987

[51] Int. Cl.⁴ .................... G01R 27/26; G01R 33/20
[52] U.S. Cl. ................... 324/57 R; 324/300; 324/58.5 C; 324/61 QS
[58] Field of Search ............... 324/316, 317, 321, 300, 324/57 R, 58.5 R, 58.5 A, 58.5 C, 60 R, 61 QS, 61 QL, 60 C, 61 R, 248

[56] References Cited

U.S. PATENT DOCUMENTS 3,622,881 11/1971 Silver et al. .................. 324/248 X
4,257,001 3/1981 Partain et al. .............. 324/61 QS X
4,623,835 11/1986 Mehdizadeh et al. ..... 324/58.5 C X
4,642,569 2/1987 Hayes et al. ..................... 324/300 X
4,737,711 4/1988 O'Hare ................................ 324/300

Primary Examiner—Reinhard J. Eisenzopf
Assistant Examiner—Robert W. Mueller
Attorney, Agent, or Firm—Fitch, Even, Tabin & Flannery

[57] ABSTRACT

An apparatus and method for measuring the electric properties of solid matter which provides data for determining the polarizability of the electron distributions contained therein is disclosed. A sample of the solid to be studied is placed between the plates of a capacitor where it acts as a dielectric. The sample is excited by the interaction of electromagnetic radiation with an atomic species contained in the sample. The voltage induced across the capacitor is then measured as a function of time with the aid of a high Q circuit tuned to a frequency related to the frequency of the applied electromagnetic energy.

17 Claims, 3 Drawing Sheets

APPARATUS AND METHOD FOR MEASURING ELECTROSTATIC POLARIZATION

The Government has rights in this invention pursuant to Contract No. DE-AC03-76F00098 awarded by the United States Department of Energy and pursuant to Grant No. DMR-83-08082 awarded by the National Science Foundation.

The present invention relates to the physical and chemical analyses of solids.

Nuclear magnetic resonance (NMR) and nuclear quadruple resonance (NQR) are often used in determining the structure of a molecular species. In particular, these techniques may be used to determine the bond angles and bond distances between the various atomic species in a compound. This is accomplished by observing the interaction of electromagnetic energy with the species when a sample of the molecular species is held in a magnetic field.

Many atoms have nuclei with magnetic dipole moments. Application of a static external magnetic field results in a series of energy levels corresponding to the quantum-mechanically allowed orientations of the magnetic dipoles relative to the magnetic field at the magnetic dipoles. Transitions between these levels can be observed by allowing the magnetic moments to interact with an oscillating magnetic field of electromagnetic radiation having a frequency corresponding to the energy difference of two of these levels. The frequency in question depends on the magnetic field at the location of the magnetic dipoles. This field is the sum of the applied magnetic field and the local magnetic fields generated by the nearby atoms. Hence, the frequency in question may be used to measure the local magnetic fields which, in turn, depend on the bond angles between the magnetic species and the atoms adjacent to these species.

The nucleus which is shaped like a football is known, conventionally, to interact with the electric fields produced by neighboring atoms. This is revealed by nuclear quadrupole resonance where the resonance frequency is determined in whole or in part by the electric field gradient across the nucleus and the magnitude of its quadrupole moment. The structure and bonding of neighboring atoms can also be inferred from nuclear quandrupole resonance measurements, but the measured signals must come from the precession of the magnetic moment of the nucleus. Many atomic species of interest such as oxygen have no such nuclear magnetic moment and, hence, may not be directly observed by NMR techniques. In addition, NMR techniques are limited to observing transitions between energy states in which the spin quantum numbers differ by 1.

Broadly, it is an object of the present invention to provide an improved apparatus and method for studying the matter in the solid state.

It is a further object of the present invention to provide an apparatus and method for studying the structure of matter in which the observed atomic species need not have a non-zero magnetic moment.

It is a yet another object of the present invention to provide an apparatus and method for studying transition between energy levels which do not differ in their spin quantum numbers by 1.

These and other objects of the present invention will become apparent to those skilled in the art from the following detailed description of the invention and the accompanying drawings.

SUMMARY OF THE INVENTION

The present invention comprises an apparatus and method for measuring the electric properties of solid matter which provides data for determining the polarizability of the electron distributions contained therein. The solid in question must be made up of a repeated unit or cell having a species which may be excited by externally applied electromagnetic radiation. The excitable species must be positioned at a non-centrosymmetric location in the cell.

A sample of the solid to be studied is placed between the plates of a capacitor where it acts as a dielectric. The electron distribution in the solid is caused to oscillate by the excitation of the excitable species. This oscillation produces an oscillating polarization in the sample which, in turn, induces a voltage across the capacitor. The induced voltage is measured as a function of time with the aid of a high Q circuit tuned to a frequency related to the frequency of the applied electromagnetic energy.

Appropriate excitation may be produced by radiofrequency pulsing as in conventional nuclear magnetic resonance techniques or by the use of photon pulsing from a suitable laser.

DETAILED DESCRIPTION OF THE INVENTION

The present invention comprises an apparatus and method for measuring an induced electric dipole moment. This measurement is uniquely sensitive to bond angle, charge concentration, and charge motion in a manner not revealed by nuclear quadrupole resonance observations. In contrast to nuclear quadrupole resonance techniques which locate neighboring atoms by virtue of their magnetic moments, in the present invention, these atoms are not required to have magnetic moments. The present invention allows one to measure both the induced dipole moments and electric quadrupole-field gradient interaction at the same time.

In addition, the present invention allows measurements to be made on samples which consist of powders. It is difficult to obtain useful data on samples consisting of powders using nuclear quadrupole measurement techniques.

Further, standard nuclear quandrupole measurement techniques can not be conveniently used to measure bond angles and the like on samples consisting of single crystals. The present invention provides a more direct measurement of the bond angles than do nuclear quandrupole measurement techinques. In particular, the present invention provides a signal which is more sensitive to the bond angles in question than the corresponding signal generated by nuclear quandrupole resonance techniques.

Finally, the present invention provides a more sensitive means for measuring the concentration of polarizable carriers than does nuclear quadrupole resonance.

The signal provided by the present invention is related to the density of polarizable charges and distances of these charges from a known nuclear species in the sample.

Figure 1:
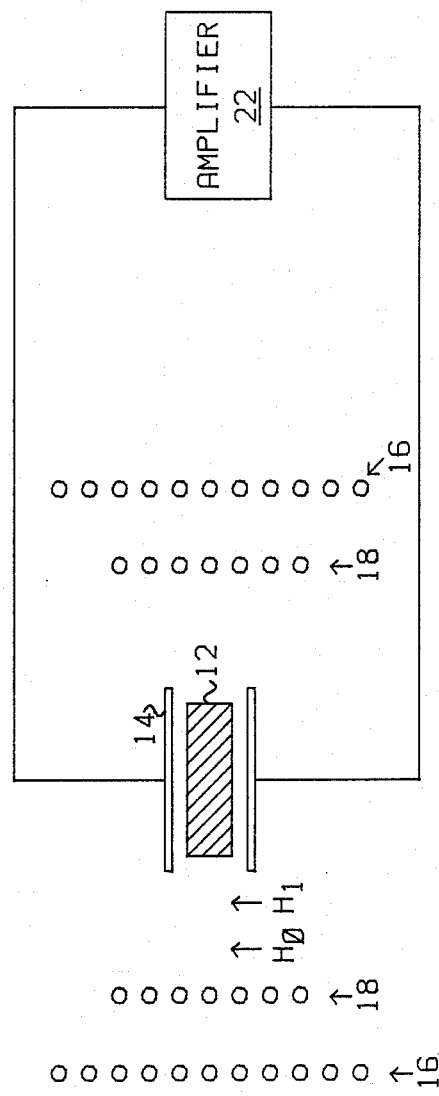
FIG. 1 is a block diagram of an apparatus according to the present invention.

The operation of the present invention may be most easily understood with reference to the embodiment of the present invention which is illustrated in FIG. 1. A sample 12 of the material to be studied is placed between the plates of a parallel plate capacitor 14. Sample 12 is subjected to two magnetic fields, a constant magnetic field, $H_0$, produced by first coil 16 and a pulsed electromagnetic field, $H_1$, produced by the application of a radiofrequency pulse to a second coil 18 of the Helmholtz type.

The pulsed electromagnetic field produces a resonance excitation of nuclei which have "football" or disc shaped charge distributions. The frequency of the pulsed electromagnetic field is chosen to excite the nuclear species of interest. In accordance with the principles of nuclear magnetic resonance, many such nuclei are placed into coherent oscillation after the excitaton by the radiofrequency pulse. After the pulse, the precesing football or disc shaped distributions produce corresponding precessing electric fields which in turn induce oscillating electric dipole moments in the nearby electron cloud distributions, provided the electron cloud distributions are noncentrosysmmetric with respect to the excited nuclear species.

The excitation of sample 12 gives rise to an oscillating electric dipole moment which induces a voltage across the capacitor 14. This signal is detected by an amplifier 22 which includes a high Q circuit tuned to the appropriate signal frequency. The resulting signal is a measure of the interaction between the precessing nuclear species and the electron distributions of the various atomic species whose electrons make up the electron cloud in question.

For example, consider the case in which the sample is a crystal of $NaClO_3$. The Cl may be excited by the radiofrequency pulse since it has a non-zero magnetic quadrupole moment. The sample consists of atomic particles consisting of a chlorine atom surrounded by three oxygen atoms and a sodium atom. The electron charge distribution produced by the sodium atom and oxygen atoms is non-centrosymmetric with respect to the chlorine atom. After the chlorine atoms are excited by a radiofrequency pulse of the proper frequency, the charge distributions of precessing chlorine atoms interact with the electron cloud produced by the oxygen and sodium atoms. This interaction induces a net dipole moment which gives rise to the signal across capacitor 14. The signal in question is a measure of the interaction between the precessing species and the electron cloud produced by the neighboring atoms, namely the oxygen and sodium atoms, and may be used to determine various quantities of interest such as the bond angle between the chlorine atoms and the oxygen atoms.

It should be noted that the output signal obtained with the present invention differs from that obtained with conventional nuclear magnetic resonance. The output signal of the present invention reflects the electric properties of the sample such as atomic structure, phase transitions, and the character of atomic fluctuations of local electric fields in the solid state. The output signal obtained from conventional nuclear magnetic resonance reflects the properties of the nuclei having non-zero nuclear moments and possible effects due to the field gradient of neighboring charges acting on the electric quandrupole moment.

Although the above example employed nuclear resonance to excite the sample, the present invention does not depend solely on nuclear excitation. In particular, it should be noted that the electric effect observed by the present invention may be produced by other forms of excitation such as electron spin paramagnetic resonance and laser beam excitation.

Figure 2:
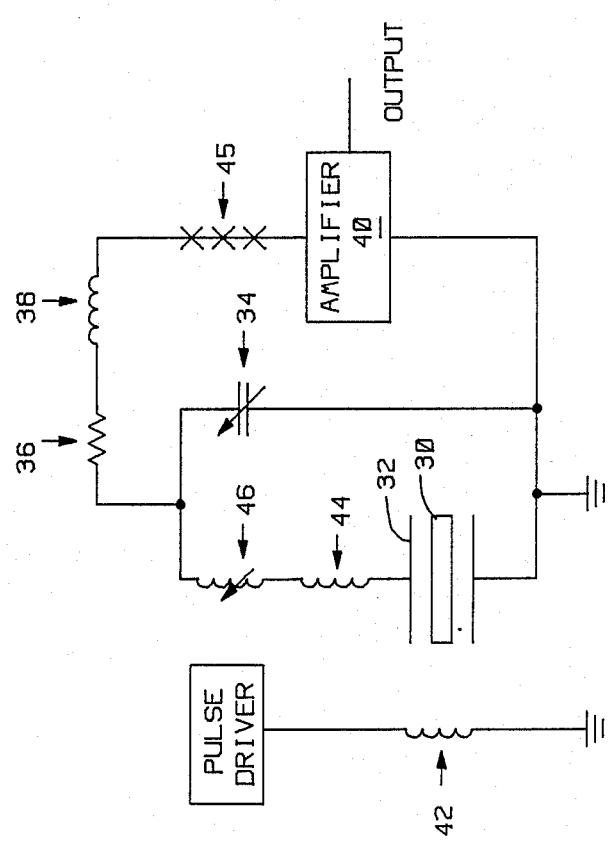
FIG. 2 is a schematic diagram of an appartus according to the present invention.

A more detailed schematic diagram of an apparatus according to the present invention is shown in FIG. 2. The sample 30 is placed between the plates of a capacitor 32 which is part of a high Q circuit consisting of the parallel combination of capacitor 32 and capacitor 34 which is connected in series with resistor 36 and inductor 38. Capacitor 34 is used to tune the high Q circuit. A radiofrequency signal applied to coil 42 is used to excite one of the atomic species in sample 30. The signal across capacitor 32 produced by the excitation of this species is amplified by a preamplifier 40.

Figure 3:
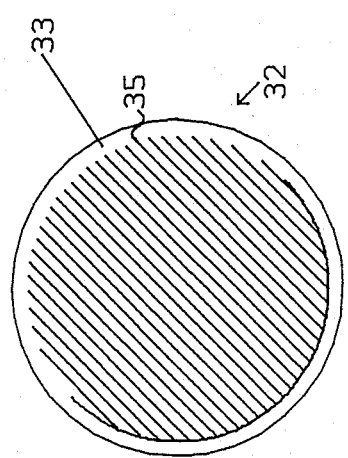
FIG. 3 illustrates the preferred structure for the sample capacitor shown in FIG. 2.

In the preferred embodiment, the plates of capacitor 32 are constructed by connecting a plurality of connected linear conductors 35 as shown in FIG. 3. This configuration inhibits the induction of eddy currents in the plates of capacitor 32 by the pulsed electromagnetic field. The plates of capacitor 32 may be constructed by plating the linear conductors 35 onto a disc 33 of insulating material using conventional electronic circuit-board construction techniques.

Sample 30 is also subjected to a small constant magnetic field having a direction perpendicular to the plates of capacitor 32. This field which is typically 0 to 10 gauss may be applied by a second coil which has been omitted from FIG. 2 for clarity. The function of this constant magnetic field will be explained in more detail below.

When the electric effect of the present invention is induced by magnetic resonance induction, an oscillating magnetic field is also produced by the precessing nuclear quadrupoles. Hence, any stray inductance in the region of the sample will be subjected to this oscillating magnetic field and will give rise to an unwanted background signal. Such a stray inductance is represented by inductor 44 in FIG. 2. To compensate for this stray inductance, a variable inductor 46 is placed in series with the capacitor.

Figure 4:
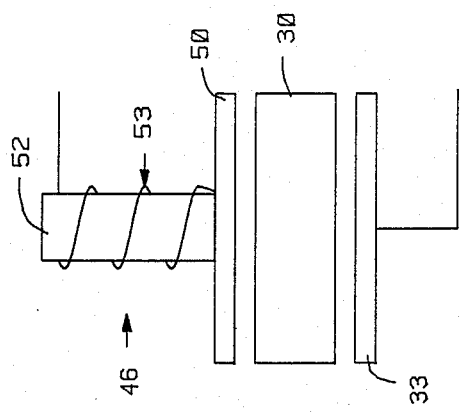
FIG. 4 illustrates the preferred mode of implementing the variable inductor shown in FIG. 2.

FIG. 4 is a more detailed cross-sectional view of variable inductor 46 and its relationship to capacitor 33. Variable inductor 46 is located as near to the capacitor 33 as possible so as to pick up a portion of the oscillating magnetic field emanating from sample 30. However, variable inductor 46 is "wound" in the opposite direction from stray inductor 44. Hence, it produces a signal which is of the opposite polarity from that produced by stray inductor 44. As a result, the signal produced by stray inductor 44 may be eliminated by adjusting the number of turns in variable inductor 46.

The number of turns in variable inductor 46 is adjusted with the aid of the top plate of capacitor 33 which is rotatably connected to a thin cylinder rod 52 which is accessible from outside the apparatus. A cooper lead 53 which is preferably constructed from fine wires twisted together is connected to the top plate 50 of capacitor 33. By rotating rod 52, the number of turns of wire in inductor 46 may be altered.

The correct number of turns is chosen by observing the signal from capacitor 33 in the absence of the constant magnetic field $H_0$. The electric effect observed by the present invention consists of a specific Zeeman beat pattern signature produced by the voltage signal on capacitor 33 after the rf electromagnetic field pulse $H_1$ tips the spins of the species being excited into coherent precession. In the absence of the constant magnetic field $H_0$, it can be shown that the electric effect of the present invention decreases to zero, while any strong nuclear magnetic induction remains. Hence, the correct number of turns for inductor 46 may be determined by adjusting the number of turns until there is no signal when $H_0$ is zero.

An alternative method of avoiding the magnetic signal is to tune the system to a frequency corresponding to a two photon transition. In this case, the applied rf frequency, w, is one half the frequency of the induced electric dipole response. Since a magnetic signal at a frequency of 2w is forbidden to first order for quantum mechanical reasons, no interfering magnetic signal is present at the frequency of the induced electric dipole response.

Referring again to FIG. 2, the preferred preamplifier 40 is dc superconducting quantum interference device (SQUID). The signals involved in detecting the electric induction phenomenon of the present invention are very small. Hence it is important to reduce the noise level in the system. As a result, the apparatus of the present invention is preferably placed in a liquid helium environment to reduce thermally induced noise levels. The details of the operation of SQUID type amplifiers are known to those skilled in the art. In particular, these details may be found in the articles by C. Hilbert and J. Clarke, Journal of Low Temperature Physics 61, 237 (1985) and C. Hilbert and J. Clarke, Journal of Low Temperature Physics 61, 263 (1985) and in the Ph.D. thesis of C. Hilbert, University of California, Berkeley California (1985). In the preferred embodiment, a series of hysteretic Josephson tunnel junctions 45 are placed in series with the SQUID to protect the SQUID form the rf pulse and shorten the recovery time of the circuit.

Although the above discussion has emphasized the induction of electric dipole moments by precessing nuclear quadrupole moments, it will be apparent to those skilled in the art that the electronic quadrupole moment distributions may be set into oscillation by other means. For example, coherent laser pulses can likewise induce electric dipole moments in non-centrosymmetric systems.

Also, laser and nuclear quadrupole excitation may be combined. For example, laser excitation may be used to create "carriers" that can respond to nuclear quadrupole excitation. For example, by creating carriers in n type InSb by means of two photon excitation with a $CO_2$ laser, the Sb nuclear quadrupole moment can serve as a local probe of the carrier fluctuation characteristics in semiconductors by measuring the electric effect of the present invention.

It should also be noted that in some situations it is possible to observe electric signals from quadrupole like distributions at frequencies much lower than the high frequency at which a main transition has been excited. This will occur if a very sharp pulse simultaneously excites many fine structure states which belong to excited or ground states of transitions which require high frequency excitation.

The electric signal of the present invention provides unique information about the location of nonmagnetic nearby atomic neighbors, particularly angular positions. Such information may not be readily obtained using nuclear magnetic resonance or nuclear quadrupole resonance techniques. For example, in the case of $NaClO_3$, the present invention permits the determination of left from right handed mirror symmetry of the O locations relative to the Na-Cl bond. Furthermore, by perturbing the sample electrically in terms of applied voltages, temperature variations, pressure changes, and laser excitations, the dynamic changes in the electronic behavior in the local atomic environment can be monitored in a manner which yields information about the local electronic polarizability. Such information can not be readily obtained using nuclear magnetic resonance methods since these methods, at most, provide information about the electric field gradient at the nucleus of the magnetic species.

There has been described herein a novel apparatus and method for the physical and chemical analyses of solids. Various modifications to the present invention will become apparent to those skilled in the art from the foregoing description and accompanying drawings. Accordingly, the present invention is to be limited solely by the scope of the following claims.

What is claimed is:

1. An apparatus for measuring the electric properties of a solid which is made up of a repeated cell, said cell having an excitable species positioned in a non-centrosymmetric location with respect to the electron distribution resulting from the other atoms in said cell, said apparatus comprising:

sample holding means for containing a sample of said solid, said sample holding means comprising a capacitor having a dielectric layer comprising said sample;

means for generating a constant magnetic field in said sample;

means for inducing oscillations in said electron distribution including means for exciting said excitable species, said inducing means being operative for a first predetermined time period; and means for detecting a voltage signal across said capacitor, said voltage signal having a frequency in a predetermined frequency range, said detecting means being operative in a second predetermined time period following said first predetermined time period, said inducing means being inoperative during said second predetermined time period.

2. The apparatus of claim 1 wherein said means for inducing oscillations comprises means for applying an electromagnetic pulse to said sample.

3. The apparatus of claim 2 wherein said electromagnetic pulse has a frequency of w and said detecting means comprises means for detecting a voltage signal having a frequency of 2w.

4. The apparatus of claim 2 wherein said means for applying an electromagnetic field pulse to said sample comprises a Helmholtz coil.

5. The apparatus of claim 4 further comprising means for applying a constant magnetic field to said sample, said constant magnetic field being parallel to the direction of the magnetic field of said electromagnetic field pulse.

6. The apparatus of claim 1 wherein said means for detecting a voltage signal across said capacitor comprises a SQUID.

7. The apparatus of claim 6 further comprising a hysteretic Josephson tunnel junction in series with said SQUID.

8. The apparatus of claim 1 wherein said means for inducing oscillations in said electron distribution comprises a laser.

9. An apparatus for measuring the electric properties of a solid which is made up of a repeated cell, said cell having an excitable species positioned in a non-centrosymmetric location with respect to the electron distribution resulting from the other atoms in said cell, said apparatus comprising:

sample holding means for containing a sample of said specimen, said sample holding means comprising a capacitor having a dielectric layer comprising said sample;

means for inducing oscillations in said electron distribution including means for exciting said excitable species, said inducing means comprising a helmholtz coil for applying an electromagnetic pulse to said sample;

means for detecting a voltage signal across said capacitor, said voltage signal having a frequency in a predetermined frequency range; and means for applying a constant magnetic field to said sample, said constant magnetic field being parallel to the direction of the magnetic field of said electromagnetic field pulse, wherein said sample holding means further comprises variable inductor means positioned adjacent to said capacitor for producing an electric signal in response to the excitation of said excitable species.

10. The apparatus of claim 9 wherein said capacitor comprises a parallel plate capacitor one plate of which being rotatably coupled to rod means and wherein said variable inductor means comprises linear conductor means electrically coupled to said capacitor plate and wound around said rod means, the number of turns of said linear conductor so wound being adjustable by rotation of said rod means.

11. The apparatus of claim 10 wherein the plates of said parallel plate capacitor comprise a plurality of linear conductors on a flat surface perpendicular to the direction of the field of said electromagnetic field pulse.

12. A method for measuring the electric properties of a solid which is made up of a repeated cell, said cell having an excitable species positioned in a noncentrosymmetric location with respect to the electron distribution resulting from the other atoms in said cell, said method comprising the steps of placing a sample of said solid between the plates of a capacitor;

generating a constant magnetic field in said sample;

inducing oscillations in said electron distribution by exciting said excitable species with electromagnetic radiation for a first predetermined time period; and detecting a voltage signal across said capacitor having a predetermined frequency during a second predetermined time period following said first predetermined time period, said electromagnetic radiation used to induce said oscillations beig absent during said second predetermined time period.

13. The method of claim 12 wherein said step of inducing oscillations in said electron distribution comprises the step subjecting said sample to a pulsed electromagnetic field.

14. The method of claim 13 further comprising the step of subjecting said sample to a constant magnetic field, said pulsed electromagnetic field being applied while said sample is being subjected to said constant magnetic field, said constant magnetic field having a direction parallel to the magnetic field of said electromagnetic field pulse.

15. The method of claim 12 wherein said step of inducing oscillations in said electron distribution comprises the step of bombarding said specimen with photons from a laser.

16. The method of claim 14 wherein said pulsed electromagnetic field has a frequency of w and said predetermined frequency is substantially equal to 2w.

17. A method for measuring the electric properties of a solid which is made up of a repeated cell, said cell having an excitable species positioned in a noncentrosymmetric location with respect to the electron distribution resulting from the other atoms in said cell, said method comprising the steps of placing a sample of said solid between the plates of a capacitor;

inducing oscillations in said electron distribution by exciting said excitable species by subjecting said sample to a pulsed electromagnetic field;

detecting a voltage signal across said capacitor having a predetermined frequency;

subjecting said sample to a constant magnetic field, said pulsed electromagnetic field being applied while said sample is being subjected to said constant magnetic field, said constant magnetic field having a direction parallel to the magnetic field of said electromagnetic field pulse; and placing a variable inductor in series with and physically adjacent to said capacitor, the inductance of said variable inductor being adjusted so that no signal is present across the series circuit comprising said variable inductor and said capacitor when said constant magnetic field is absent.

* * * * *

UNITED STATES PATENT AND TRADEMARK OFFICE
CERTIFICATE OF CORRECTION

PATENT NO. : 4,833,392

DATED : May 23, 1989

INVENTOR(S) : Erwin L. Hahn, et al.

It is certified that error appears in the above-identified patent and that said Letters Patent is hereby corrected as shown below:

Column 3, Line 22, "precesing" should be --precessing--.

Column 8, Line 8, "beig" should be --being--.

Signed and Sealed this

Thirteenth Day of March, 1990

Attest:

JEFFREY M. SAMUELS

*Attesting Officer*    Acting Commissioner of Patents and Trademarks